United States Patent [19]
Torii et al.

[11] Patent Number: 5,517,041
[45] Date of Patent: May 14, 1996

[54] SEMICONDUCTOR DEVICE

[75] Inventors: Kensuke Torii; Yasuhiro Oguchi; Yasuhisa Hirabayashi; Masuo Tsuji, all of Suwa, Japan

[73] Assignee: Seiko Epson Corporation, Tokyo, Japan

[21] Appl. No.: 50,119

[22] PCT Filed: Sep. 2, 1992

[86] PCT No.: PCT/JP92/01119
§ 371 Date: Jun. 25, 1993
§ 102(e) Date: Jun. 25, 1993

[87] PCT Pub. No.: WO93/05537
PCT Pub. Date: Mar. 18, 1993

[30] Foreign Application Priority Data

Sep. 2, 1991 [JP] Japan .................................... 221628

[51] Int. Cl.⁶ .................................................. H01L 27/10
[52] U.S. Cl. ........................... 257/206; 257/207; 257/369; 257/390
[58] Field of Search ..................... 257/206, 204, 257/207, 369, 390, 412

[56] References Cited

FOREIGN PATENT DOCUMENTS

| 0360596 | 3/1990 | European Pat. Off. ............... 257/206 |
| 61645 | 4/1983 | Japan . |
| 193467 | 8/1986 | Japan . |
| 244148 | 10/1987 | Japan . |
| 63-107140 | 5/1988 | Japan ..................... 257/206 |
| 160859 | 11/1989 | Japan . |
| 23659 | 1/1990 | Japan . |
| 16174 | 1/1991 | Japan . |
| 104275 | 5/1991 | Japan . |
| 263854 | 11/1991 | Japan . |

Primary Examiner—Sara W. Crane
Attorney, Agent, or Firm—Harness, Dickey & Pierce

[57] ABSTRACT

Four gate electrodes of an n-type basic cell of a gate array are essentially oriented in a circular tangential direction of a radius relative to the center point Q of a cell. The electrodes have an upper and lower and a right and left symmetrical layout arrangement relative to the cell upper and lower center line and left and right center line. As a consequence, adjacent gate electrodes are positioned in a ±90° rotating symmetry. Each gate electrode has wiring connection areas on both ends. The wiring connection areas overlap the pre-rotation wiring connection areas by a ±90° rotation of the cell. Because the gate electrodes are essentially oriented along the circumference direction, the source and the drain are separated in the radial direction of the center of the cell. The wiring connection areas are not concentrated at the center of the cell, and this improves the wiring capabilities within the cell. In addition, because each end of the gate electrodes has an equal positional relationship relative to the center of the cell, the gate electrodes may have wiring connection areas not only on one end, but on both ends. This improves the wiring capability of each gate. The p-type basic cell has the same structure as the n-type basic cell.

18 Claims, 14 Drawing Sheets

SEMICONDUCTOR DEVICE

BACKGROUND OF THE INVENTION

This invention relates generally to a semiconductor device. In particular, it relates to a master slice type gate array that uses a plurality of insulated gate field effect transistors (MIS transistors) as the basic cells.

The internal chip structure in the channel-less gate array of the prior art is composed of columns of cells in which a plurality of basic cells in the center of the silicon chip are arranged in regular horizontal and vertical rows. A plurality of input and output buffers surround the periphery of the silicon chip. In a gate array, the structure of the basic cells is important in terms of configuring the desired logic gates and logic blocks through wiring connections. One known example of a basic cell structure is disclosed in Japanese Patent No. 16174/91, as shown in FIG. 14.

As shown, basic cell 1 runs along well 2, which has a symmetrical shape from top to bottom and left to right, and along radial lines $1_1$ to $1_4$, which are centered on center point Q of well 2 gate surface. In addition, except for the area around center point Q, the basic cell has gate electrodes 3 formed on top of well 2. Each section of well 2 that is partitioned by gate electrode 3 is alternately in source region S and drain region D.

In basic cell 1, gate electrodes are oriented in a radial direction. Since the shape of the cell is symmetrical relative to top and bottom centerline $1_2$ and right and left center line $1_1$, it is possible to use the basic cell in the right and left symmetry and the top and bottom symmetry. This increases the degree of circuit design freedom and reduces unused region of the gates.

However, the basic cell described above has the following problems:

(1) A plurality of gate electrodes 3 are oriented in the radial direction relative to center point Q. Source regions S and drain regions D, which are partitioned by gate electrodes 3, are also individually oriented in the radial direction relative to center point Q. Therefore, in this basic cell, the tendency is to wire each electrode in the radial direction. As a result, although there is a high-level of freedom for external wiring for basic cell 1, there is a low-level of freedom for internal wiring of the transistors within basic cell 1.

Basic cell 1 has a basic cell structure that includes centrifugal characteristics. As shown in FIG. 14, as to wire connection areas 3a of gate electrodes 3, because a plurality of gate electrodes 3 converge on the center of well 2, it is difficult to put connections on the inner ends of gate electrodes 3. Therefore, they are placed only on the outer ends. As a result, in the case of internal cell wiring, detour wiring and long distance wiring between wiring connection areas 3a of the outer ends are unavoidable. Moreover, the mutual wiring between source region S and drain region D is difficult and the wiring within the cell is poor.

(2) In general, in the technology of the prior art, each gate electrode of the basic cell has wiring connection areas on both ends in the non-active regions, which facilitates wiring of the gate electrodes. However, as stated earlier, in basic cell 1 described above, because a plurality of gate electrodes 3 converge on the center of well 2, an inadequate amount of wiring connection area is available at the center. Thus, it is difficult to place wiring connections on the inner ends of gate electrodes 3. As a result, there is a low degree of freedom for wiring of the special gate electrodes.

For these reasons, a purpose of this invention is to resolve the problems stated above. The invention provides for a basic cell that has top and bottom symmetry and left and right symmetry. The basic cell structure is configured to allow a high-level of freedom for the internal wiring within the basic cell. The basic cell structure allows the gate electrodes to have a wiring connection area on both ends.

SUMMARY OF THE INVENTION

In this invention, the structure of the basic cell has a rotating symmetry. The basic cell has 4n (where n is a positive integer) MIS transistors. In addition, the wiring connection areas of the transistors have overlapping rotating symmetry relative to the same type of wiring connection areas of different transistors before a ±90° rotating operation. The invention uses a structure in which the gate electrodes of the transistors are essentially oriented along a circumference relative to the center of the basic cell.

By using such a structure, the source region and the drain region are located along the radial direction relative to the cell center. Thus, the ends of the gate electrodes are not concentrated at the center of the cell, and the wiring within the cell is improved.

In addition, both ends of each gate electrode have an equal positional relationship relative to the center of the cell. Thus, each gate electrode has wiring connection areas on both ends, not just on one end, which improves wiring capability of the gate electrodes. Thus, a basic cell that has centripetal characteristics is obtained.

In such a basic cell structure, each gate electrode has a linear shape. In addition, the gate electrode may have a hook shape that is open to the outside of the cell. The transistors within the basic cell can have either an independent relationship or a parallel relationship. In other words, for those transistors for which a common dopant region is formed for the source region or the drain region of each gate, it is possible that each transistor has a parallel relationship. For those gate electrodes for which an independent dopant region is formed for the source region or the drain region of each gate electrode, it is possible that each transistor is mutually independent of another.

If a first conductive basic cell and a second conductive basic cell with such a structure are used, a variety of cell array structures can be obtained. For example, it is desirable to have an array structure that alternately places the first conductive basic cell and the second conductive basic cell on the top and bottom and the left and right in an array. In such a structure, it is desirable that the first power supply wiring and the second power supply wiring between the first conductive basic cell and the second conductive basic cell be formed alternately in the row direction and the column direction. This is because the supply of electrical power to each cell is easy with short wiring.

In addition, a structure may have the stopper regions located right beneath the first power supply wiring and the second power supply wiring. In such a case, power is supplied to the stopper regions without requiring special wiring by using a contact hole within the width of the power supply wiring. If the stopper regions are formed in a ring shape that surround the cell, uniform voltage stabilization can be achieved even with a plurality of transistors in the cell.

Moreover, if a via that is connected to the intersection area of the first power supply wiring extending in the row direction and the first power supply wiring extending in the column direction is provided, and if a via that is connected to the intersection area of the second power supply wiring extending in the row direction and the second power supply wiring extending in the column direction is provided, uniform stabilization of the power supply voltage of the entire chip can be achieved.

In a case where the stoppers of two basic cells of the same type described above are positioned diagonally from each other and are connected, it is possible to restrain voltage fluctuations between adjacent cells even if variable wiring resistances exist.

In another array structure, the size of the first conductive basic cell and that of the second conductive basic cell are essentially the same. Furthermore, row n and column m of the first conductive basic cell are made the first conductive block, and row n and column m of the second conductive basic cell are made the second conductive block. Additionally, the first conductive block and the second conductive block are alternately arrayed from top to bottom and left to right.

In this kind of array structure, it is desirable to form adjacent first power supply wiring and second power supply wiring between the first conductive basic cells within the first conductive block and between the second conductive basic cells within the second conductive block in the row direction and the column direction. The basic cell stopper region are formed right beneath the first power supply wiring and the second power supply wiring. It is desirable to provide a via that connects the first power supply wiring, which extends in the row direction, and the first power supply wiring, which extends in the column direction at the area where they intersect. It is also desirable to provide a via that connects the second power supply wiring, which extends in the row direction, with the second power supply wiring, which extends in the column direction, at the area where they intersect. This promotes the uniform stabilization of the power supply voltage of the entire chip region.

In still another array structure, the n1 rows and m1 columns of the first conductive basic cell are the first conductive block, and the n2 rows and m2 columns of the second conductive basic cell are the second conductive block. The size of the first conductive block and that of the second conductive block are essentially the same. The first conductive block and the second conductive block are arrayed alternately from top to bottom and left and right.

Other objects and attainments together with a fuller understanding of the invention will become apparent and appreciated by referring to the following description and claims taken in conjunction with the accompanying drawings.

DESCRIPTION OF THE PREFERRED EMBODIMENTS

First Embodiment

Figure 1:
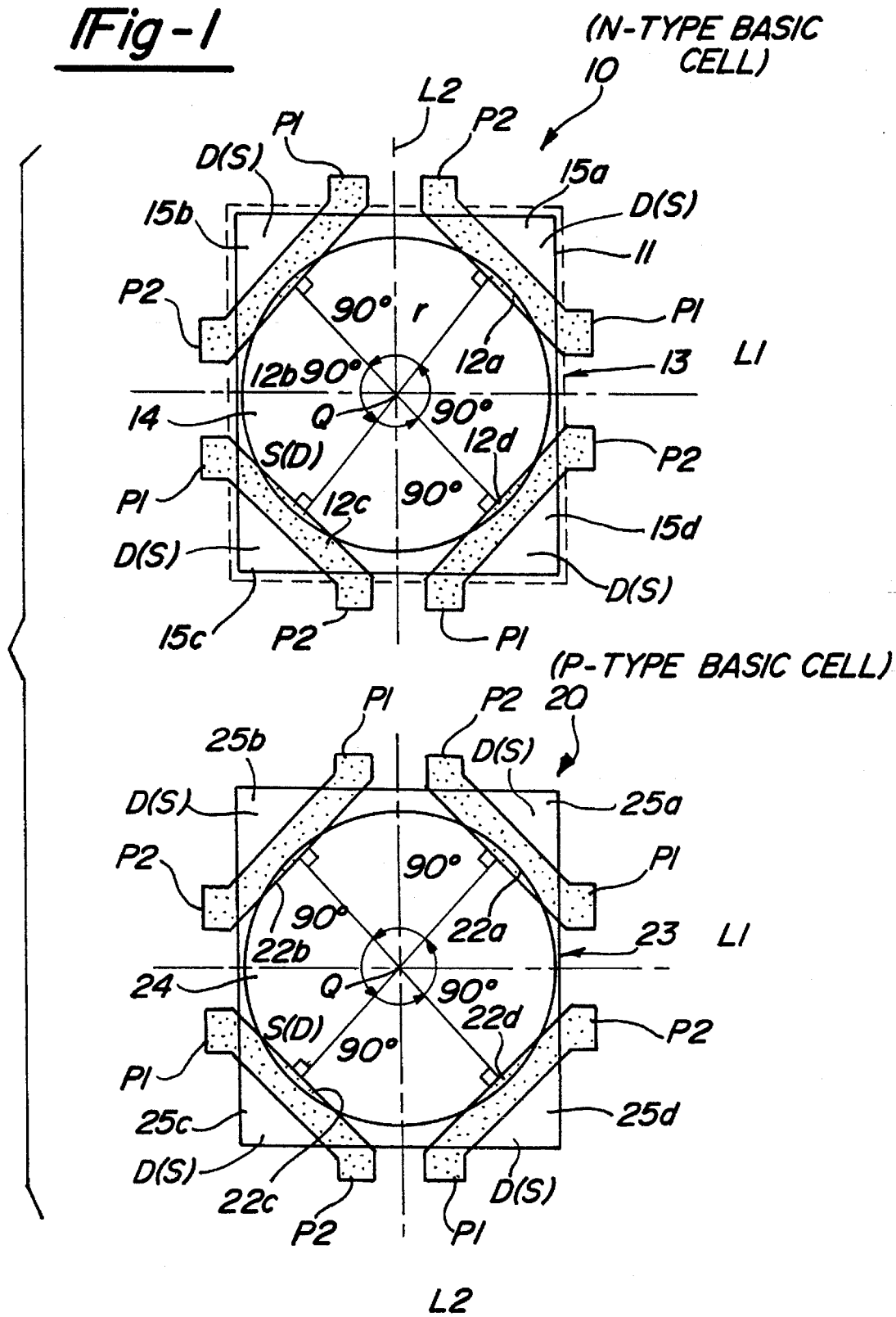
FIG. 1 shows a top view of the structure of the basic cell according to the first embodiment of this invention.

FIG. 1 shows a top view of the structure of the basic cell according to the first embodiment of this invention. As shown, the basic cell is fabricated from n-type basic cell 10, which has four n-type MOS transistors on top of a silicon chip, and p-type basic cell 20, which is adjacent to the n-type basic cell and has four p-type MOS transistors on top of this silicon chip. In n-type basic cell 10, p-well 11 occupies a planar rectangular shaped (square shaped) region that is formed by diffusing a p-type dopant on an n-type substrate. Four polysilicon gate electrodes 12a to 12d each lie across a corner of p-well 11 and are each formed through a gate insulation layer. High concentration n-type dopant region 13 also occupies a planar rectangular shaped (square shaped) region that is formed through self-alignment by ion implantation of an n-type dopant using the gate electrodes as a mask.

Four gate electrodes 12a to 12d are essentially oriented in a circular tangent direction of an imaginary radius r relative to the cell center point Q. The gate electrodes have a top and bottom and left and right symmetrical positional relationship relative to the cell top and bottom center line L1 and the cell right and left center line L2. Therefore, adjacent gate electrodes are positioned in a rotating symmetry of ±90°. Each of gate electrodes 12a to 12d has wiring connection areas P1 and P2 (contact positions for wiring) on both ends of the non-active region. Wiring connection areas P1 and P2 overlap with the same type of connection areas P1 and P2 before a ±90° rotation of basic cell 10.

Since inner center region 14 of high concentration n-type dopant region 13 is a common dopant region, it is a common source region S or a common drain region D for gate electrodes 12a to 12d depending on the wiring connections. On the other hand, within high concentration n-type dopant region 13, corner regions 15a to 15d each are the dedicated drain region D or the dedicated source region S of one of gate electrodes 12a to 12d depending on the wiring connections. As a result, with basic cell 10, the parallel connectability of the transistors within the cell is improved, allowing the parallel connection of up to four transistors. It is also possible to connect two transistors serially.

Since gate electrodes 12a to 12d are essentially oriented along the circumference direction, dopant region 13 in the radial direction of cell center point Q is divided into source region S (or drain region D) and drain region D (or source region S). As a result, because wiring connection areas P1 and P2 of gate electrodes 12a to 12d are not concentrated near the center of the cell, it is easy to connect the gate electrodes, the source electrodes and the drain electrodes inside the cell, improving the wiring capability inside the cell. In addition, since gate electrodes 12a to 12d are essentially oriented along the circumference direction, the end of each of gate electrodes 12a to 12b has an equal positional relationship relative to the cell center point Q. As a result, it is not only possible for gate electrodes 12a to 12d to have wiring positions P1 and P2 on just one end, but on both ends. As a consequence, the wiring capability relative to each of gate electrodes 12a to 12d also improves. Moreover, although gate electrodes 12a to 12d have a left and right symmetrical shape relative to the center line of each gate electrode, they may have other shapes that provides only one wiring connection area.

The cell structure of p-type basic cell 20 is the same as that of n-type basic cell 10. P-type basic cell 20 has a high concentration p-type dopant region 23 that occupies a planar rectangular shaped (square shaped) region. Four polysilicon gate electrodes 22a to 22d each lie across a corner of this dopant region 23 and are formed through gate insulation layers.

Four gate electrodes 22a to 22d are essentially oriented in a circular tangent direction of an imaginary radius r relative to the cell center point Q and have a top and bottom and left and right symmetrical positional relationship relative to the cell top and bottom center line L1 and the cell right and left center line L2. Therefore, adjacent gate electrodes are positioned in a rotating symmetry of ±90°. Each of gate electrodes 22a to 22d has wiring connection areas P1 and P2 (contact positions for wiring) on both ends of the non-active region. Wiring connection areas P1 and P2 overlap with the same type of connection areas P1 and P2 before a ±90° rotation of basic cell 20.

Since inner center region 24 of high concentration n-type dopant region 23 is a common dopant region, it is a common source region S or a common drain region D for each of gate electrodes 22a to 22d depending on the wiring connections. On the other hand, within high concentration n-type dopant region 23, corner regions 25a to 25d each are the dedicated drain region D or the dedicated source region S of one of gate electrodes 22a to 22d depending on the wiring connections. As a result, with basic cell 20, the parallel connectability of the transistors within the cell is improved, allowing the parallel connection of up to four transistors. In the p-type basic cell as well, gate electrodes 22a to 22d are essentially oriented along the circumference direction, improving wiring capability within the cell and relative to the gates, just as is the case of n-type basic cell 10 described above.

In general, however, the wiring of a gate array is determined by the automatic layout and wiring process of a computer. In such a case, items such as the wiring and basic circuitry within the basic cell and the CMOS basic cell are stored as a library within the computer. In automatic wiring, a plurality of basic cells are used on the gate arrays and the wiring step is executed. However, because of this automation, the regions occupied by certain basic cells (cell areas) are not used as transistors. It is often the case that those regions are used only as wiring regions.

The fact that certain basic cells will be used as wiring regions is taken into consideration in the channel-less gate arrays. However, by manually modifying the wiring path locally, it is possible to reduce the number of cells used only for wiring as well as possible to restore the cells' transistor function. In particular, when the basic cell has top and bottom symmetry and left and right symmetry, it is possible to restore the cells used only for wiring as transistors. Here, the top and bottom and right and left symmetry of the cell means that the cell has ±90° rotating symmetry. However, in spite of what the detailed shape of the gate electrode itself is, it is necessary for the wiring connection areas of the transistors within the cell to overlap with those before the ±90° rotation.

For a basic cell such as this one, the internal wiring does not have to be modified by a rotational operation. Not modifying the wiring within the cell means that the wiring library stored within the computer can be used as is. Thus, the system can work on a small number of libraries. Moreover, because the wiring within the cell is not modified and cell rotational layout (rotation of the wiring pattern within the cell) is possible, there is no change in the wiring capacity, for example, from rotation. Also, the electrical properties of the cell do not change.

As for the external wiring between the cells, it is possible to connect them with short wires using the cell rotational layout, which allows a reduction in wiring capacity and an improvement in electrical properties.

Both basic cell 10 and basic cell 20 described above have a symmetry relative to the wiring connection areas. Therefore, in the case of automatic wiring, when there are cells that are used only for wiring, by a ±90° rotation or by the top and bottom and left and right symmetrical operation of the basic cell in the periphery, the wiring of the cells that are used only for wiring will be eliminated and it will be possible to shift them to another location, allowing that cell to be restored to a transistor. As a result, this will create some tolerance in integrating large scale logic circuits without enlarging the size of the chip.

Figure 2:
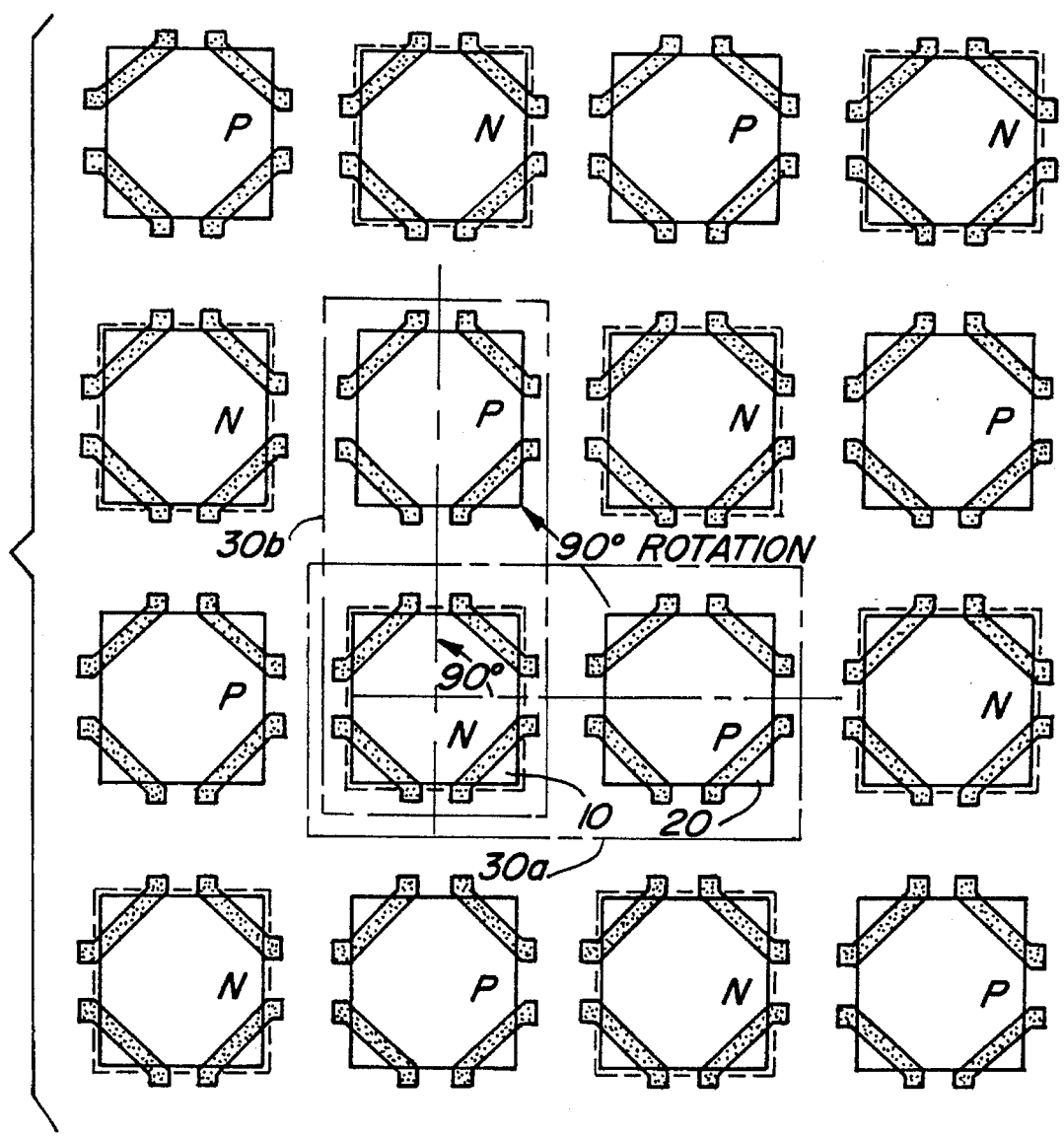
FIG. 2 shows a top view of the array structure of the basic cell of the first embodiment.

The above embodiment utilizes n-type cell 10 with four n-type transistors as the basic cell and p-type cell 20 with four p-type transistors as the basic cell (unit cell). In general, however, a CMOS unit used as the basic cell is more similar to an actual basic gate or logic block. Sometimes, this is convenient. FIG. 2 illustrates an example. An array structure that has n-type basic cell 10 and p-type basic cell 20 fabricated on the chip alternately in a checkered configuration from top and bottom and on left and right is utilized. The CMOS basic cell, which is formed using n-type basic cell 10 and p-type basic cell 20 as a pair, is used as a unit.

In FIG. 2, when CMOS cell 30a, which is surrounded by the one-dot line, is moved to CMOS cell 30b, which is surrounded by a solid line, the wiring pattern within the cells of CMOS basic cell 30a should rotate +90° in the computer. The 90° rotation of the wiring pattern of this CMOS basic cell is accomplished by a +90° rotation operation of the wiring pattern of n-type cell 10 of CMOS basic cell 30a as well as a +90° rotation and a parallel shift of the wiring pattern of the p-type cell a CMOS basic cell 30a. The operation of parallel shift is performed by transferring the wiring pattern of the library on the computer. Thus, if a CMOS unit library is stored, the wiring patterns of cells 10 and 20 should both be rotated 90°.

Since both cells 10 and 20 have symmetry in which the wiring connection areas overlap before a rotation of the cell, the internal wiring connections of the CMOS basic cell allows changes in the wiring of the cell without affecting the connections of the internal wiring of the CMOS basic cell, thus capturing the special features within the cell without adding a library. It is also possible to freely reverse the top and bottom and left and right of the cell.

Figure 3:
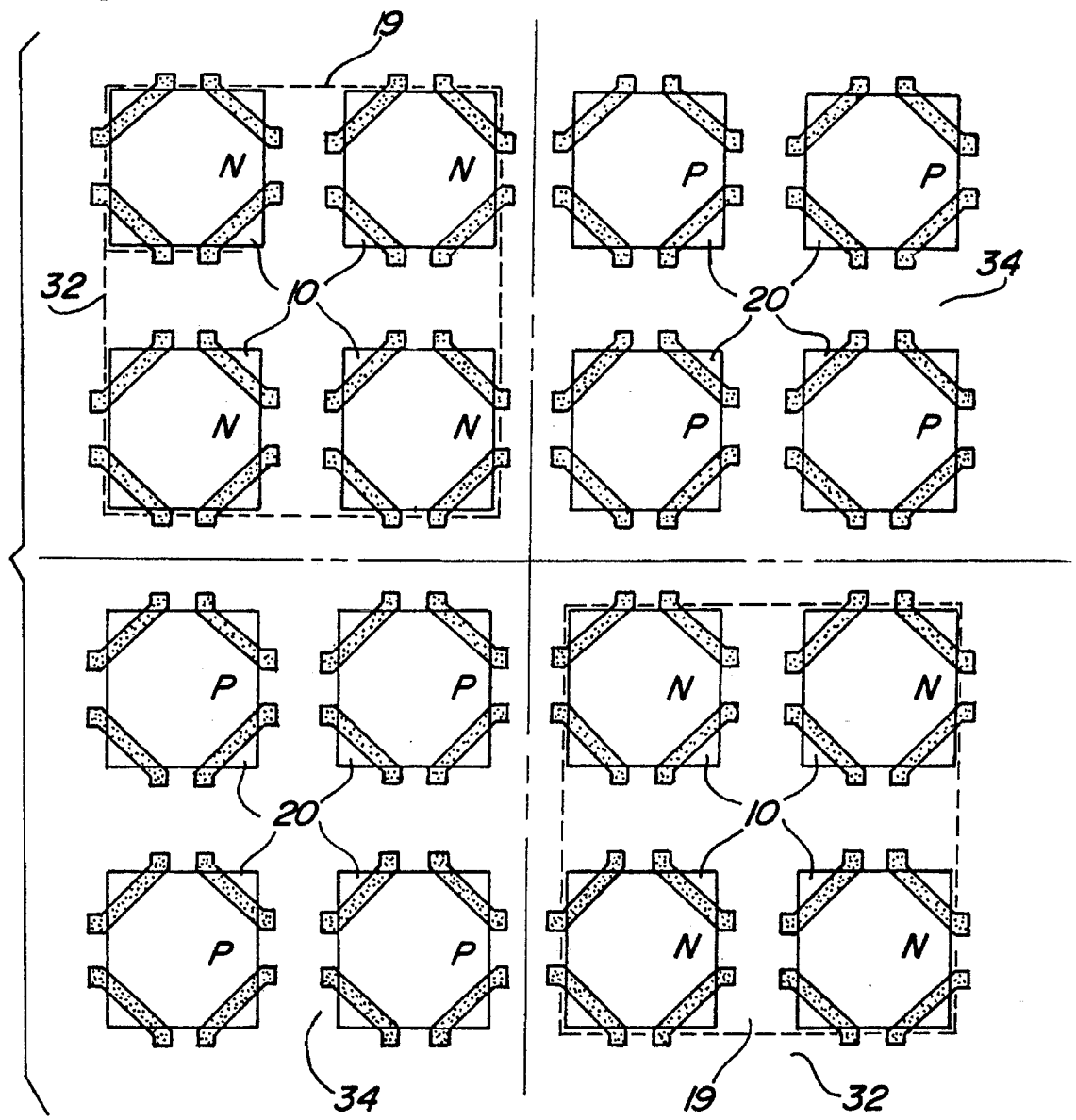
FIG. 3 shows a top view of another array structure of the basic cell of the first embodiment.

FIG. 3 shows the array structure of another cell. A common well 19 is formed for four n-type basic cells 10. N-type block 32 of these four n-type cells 10 and p-type block 34 of the four p-type cells 20 are arrayed in a checkered configuration. Of course, it is possible to use the CMOS basic cell, made from the pair of n-type block 32 and p-type block 34, as a unit. Even with such an array structure, it is possible to rotate the cells ±90° and reverse the top and bottom and left and right without changing the internal wiring, which makes changes in the layout simple.

Second Embodiment

Figure 4:
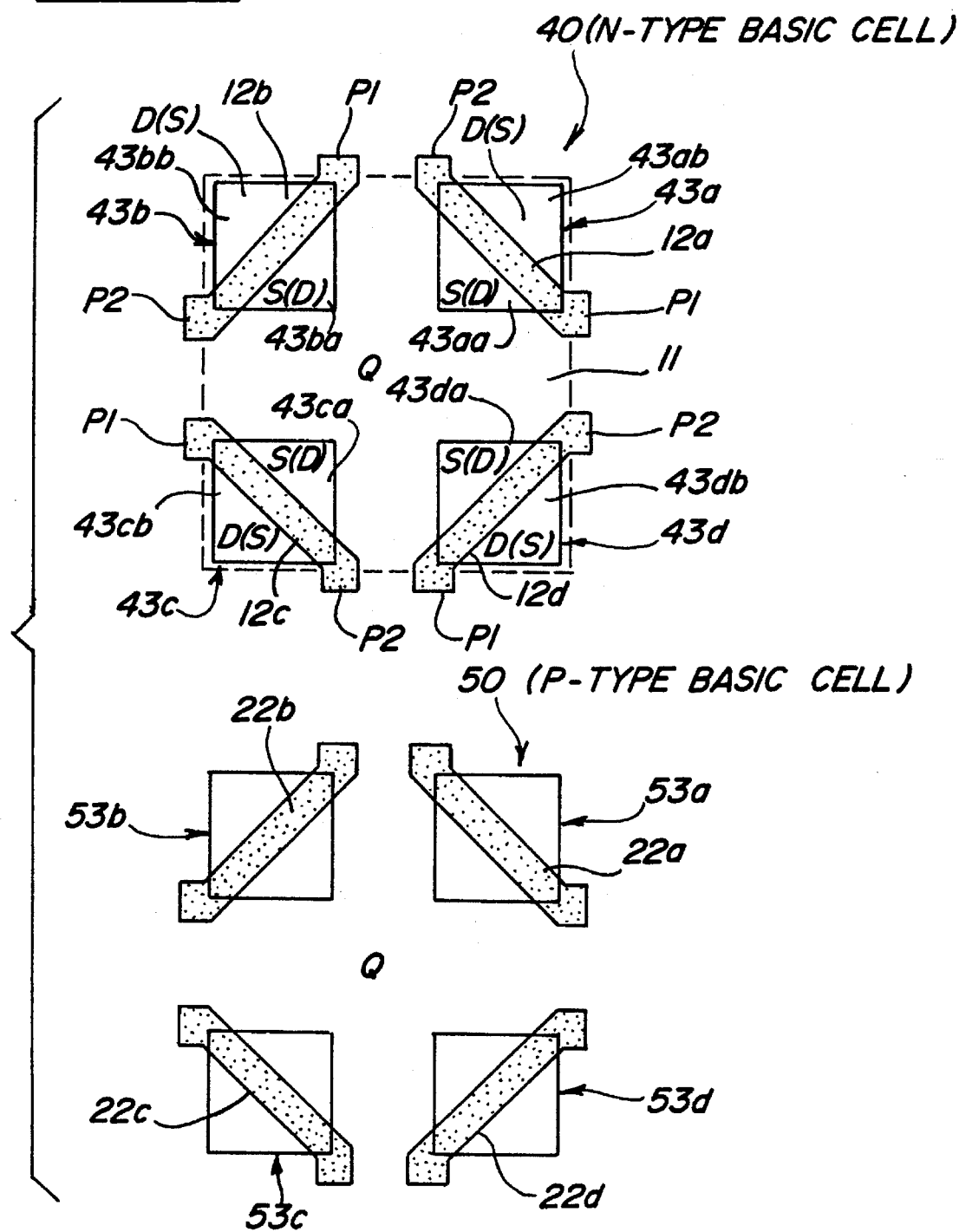
FIG. 4 shows the structure of the basic cell according to the second embodiment of this invention.

FIG. 4 shows a top view of the structure of the basic cell according to the second embodiment of this invention. N-type basic cell 40, which has four n-type MOS transistors, and p-type basic cell 50, which is adjacent to n-type basic cell 40 and has four p-type MOS transistors, are fabricated on top of a silicon chip. In contrast to the common dopant regions 13 and 23, which are the common source or drain regions in basic cells 10 and 20 in the first embodiment, those for n-type basic cell 40 and p-type basic cell 50 are each formed independently relative to each gate in this embodiment.

In n-type basic cell 40, p-well 11 occupies a planar rectangular shaped (square shaped) region formed by diffusing a p-type dopant on top of an n-type substrate. Four polysilicon gate electrodes 12a to 12d each are formed across a corner of p-well 11 through a gate insulation layer. High-concentration n-type dopant regions 43a to 43d occupy the planar rectangular shaped (square shaped) regions and are formed through self-alignment by ion implantation of an n-type dopant using the gate electrodes as a mask.

As in the first embodiment, four gate electrodes 12a to 12d are essentially oriented in a circular tangent direction of an imaginary radius relative to the cell center point Q. Also, the adjacent gate electrodes are in a rotating symmetry position of ±90°. In addition, each of gate electrodes 12a to 12d has wiring connection areas P1 and P2 on both ends in the non-active region.

High concentration n-type dopant regions 43a to 43d are partitioned by gate electrodes 12a to 12d, respectively. Inner dopant regions 43aa to 43da are used as the source regions or the drain regions depending on the wiring connections. Outer dopant regions 43ab to 43db are used as the source regions or drain regions depending on the wiring connections.

Since each transistor within basic cell 40 is independent, parallel connection and serial connection can be made relatively freely between the transistors. In this embodiment, since gate electrodes 12a to 12d are essentially oriented in a circumference direction, each dopant region in the radial direction of the cell center point Q is divided into source region S and drain region D. Also, the wiring connection areas P1 and P2 of gate electrodes 12a to 12d are not concentrated in the center of the cell. Therefore, it improves the wiring capability between the gate electrodes, the source electrode and the drain electrodes within the cell.

As for wiring within the cell, it is easy to use the area around the center of the cell due to the extra room on the inner regions of the gate electrodes. It is also possible to reduce the paths of wiring connection outside the cell. As a result, the obstructive regions from the external wiring can be reduced, which improves the external wiring capability. Moreover, since gate electrodes 12a to 12d are essentially oriented in the circumference direction, wiring connection areas P1 and P2 can be on one end of gate electrodes 12a to 12d, or on both ends of these gate electrodes. As a result, the wiring capability of gate electrodes 12a to 12d is improved.

P-type basic cell 50 has the same cell structure as n-type basic cell 40. In p-type basic cell 50, high concentration p-type dopant regions 53a to 53d occupy a planar rectangular shaped (square shaped) region. Four polysilicon gate electrodes 22a to 22d each are formed across a corner of dopant regions 53a to 53d through a gate insulation layer. As in basic cell 40, four gate electrodes 22a to 22d are essentially oriented in a circular tangent direction of an imaginary radius relative to the cell center point Q. Also, the adjacent gate electrodes are in a rotating symmetry position of ±90°. In addition, each of gate electrodes 22a to 22d has wiring connection areas P1 and P2 on both ends in the non-active region. This cell 50 also has improved wiring capability within the cell and the wiring capability of the gate electrodes is improved.

It is possible to use basic cells 40 and 50 of this embodiment in the array structure shown in FIGS. 2 and 3 to structure a CMOS unit. It is also possible to rotate the cells ±90° as well as reverse the top and bottom and left and right without changing the internal wiring, which makes changes in the layout simple.

Third Embodiment

Figure 5:
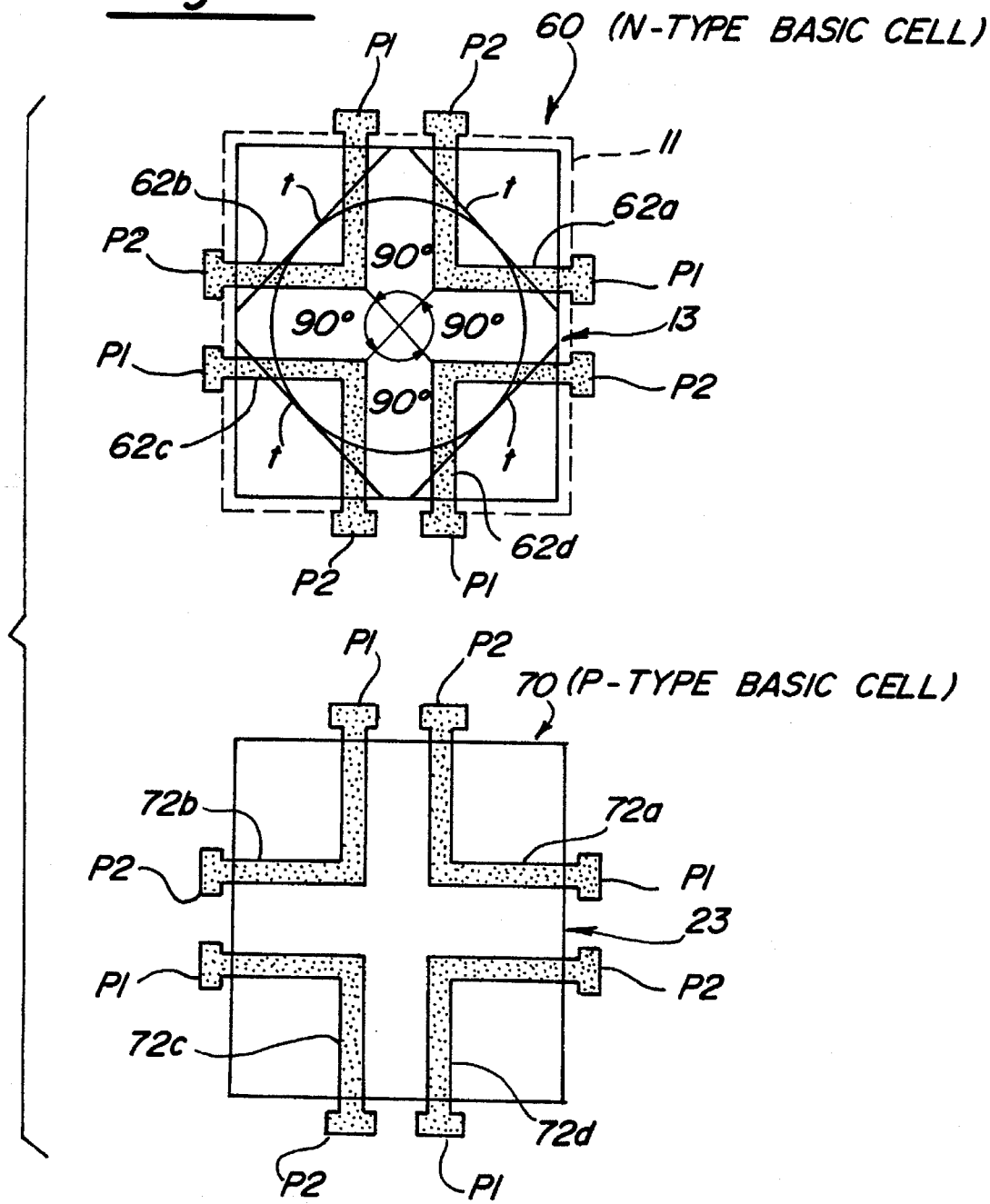
FIG. 5 shows a top view of the array structure of the basic cell according to the third embodiment of this invention.

FIG. 5 shows a top view of the basic cell structure according to the third embodiment of this invention. In this embodiment, the same reference numerals are used for the same elements in the first embodiment, and an explanation of these will be omitted. N-type basic cell 60 and p-type basic cell 70 in the embodiment each have a structure that is similar to that of basic cells 10 and 20 in the first embodiment. In contrast to the linear shape of gate electrodes 12a to 12d and 22a to 22d in basic cells 10 and 20, the shape of gate electrodes 62a to 62d and 72a to 72d of this embodiment is that of a hook which curves almost at a right angle and is open to the outside along the vertical and horizontal directions.

As in the first embodiment, the hook-shaped gate electrodes 62a to 62d and 72a to 72d are oriented in a circular tangential direction of the imaginary radius relative to the cell center point Q. This is because both sides of dopant regions 13 and 23 are partitioned by gate electrodes 62a to 62d and 72a to 72d and the source and drain regions are positioned in the radial direction relative to the center of the cell. In addition, adjacent gate electrodes are in a ±90° rotating symmetry position. Each of gate electrodes 62a to 62d and 72a to 72d has a wiring connection area on both ends in the non-active region.

The wiring within the cell is improved by using hook-shaped gate electrodes 62a to 62d and 72a to 72d. Moreover, gate electrodes 62a to 62d and 72a to 72d are essentially oriented in the circumference direction. Therefore, both ends of the gate electrodes have an equal relationship relative to the center point Q of the cell. Thus it is possible to have wiring connection areas P1 and P2 not only on one end, but on both ends. It is also possible to provide a contact area within the inner regions other than the areas around the center point Q.

Figure 6:
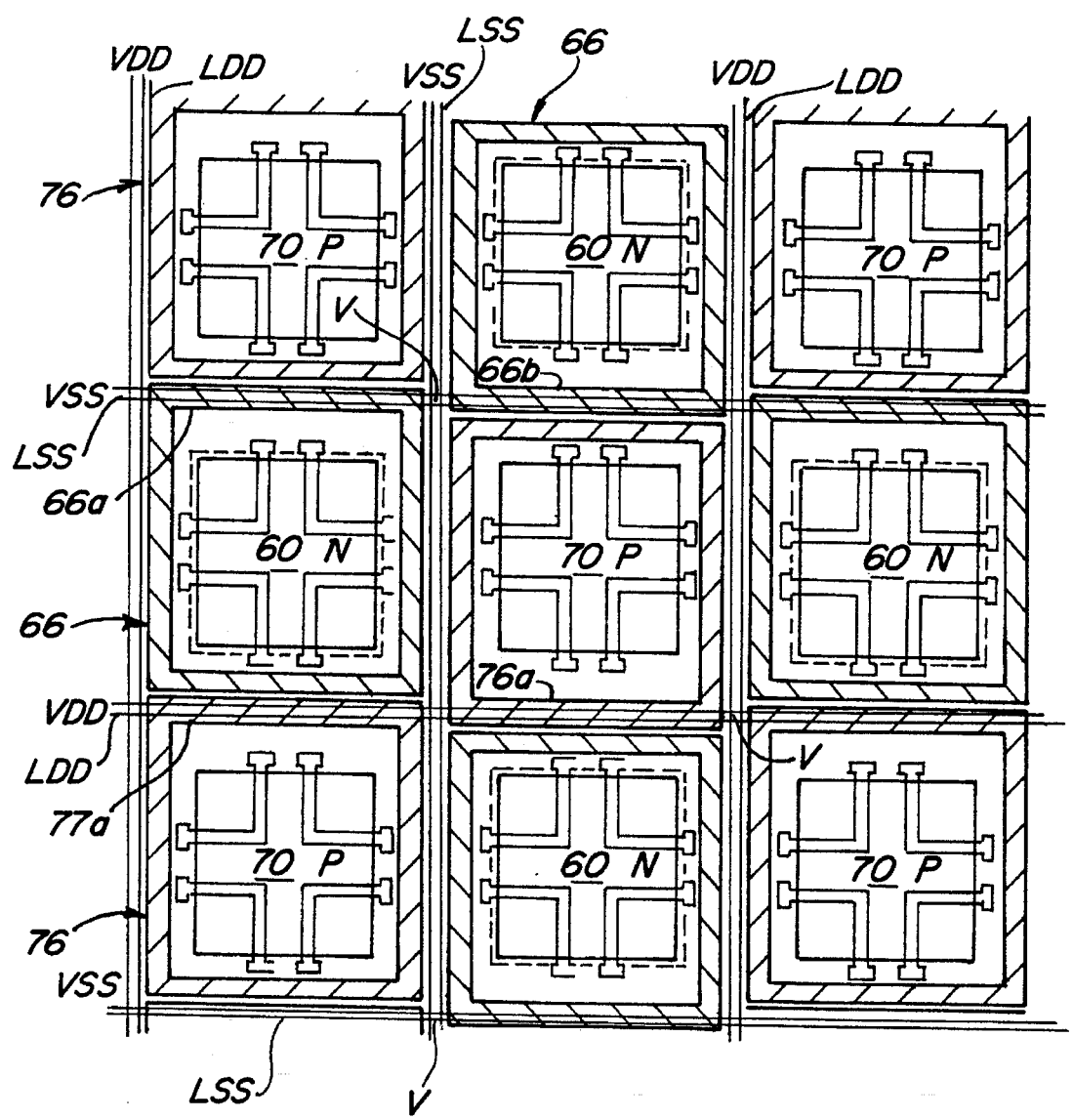
FIG. 6 shows a top view of the array structure of the basic cell of the third embodiment.

FIG. 6 shows the array structure of basic cells 60 and 70 described above. This array structure, like that shown in FIG. 2, has n-type basic cell 60 and p-type basic cell 70 arrayed alternately vertically and horizontally in a checkered configuration. N-type basic cell 60 has a ring-shaped p-type stopper 66 (guard band) that is to be connected to power supply Vss. In addition, p-type basic cell 70 has a ring-shaped n-type stopper 76 (guard band) that is to be connected to power supply Vdd. Because stoppers 66 and 77 are ring-shaped and surround the cells, latch up due to the substrate electrical potential stability can be restrained. Moreover, the power supply capacity is also increased.

FIG. 6 shows power supply wiring Lss of power supply Vss and power supply wiring Ldd of power supply Vdd. In this gate array, two layers of aluminum are used for the wiring. As a rule, the definition is that wiring that runs in the horizontal direction is the first layer of aluminum wiring and the wiring that runs in the vertical direction is the second layer of aluminum wiring. There are times when the horizontal wiring is formed in the second layer and the vertical wiring is formed in the first layer in order to prevent the crossing of the wires locally, for example. As for the wiring within the cell, the basis is horizontal wiring in the first layer of wiring, and as an exception, vertical wiring may be in the first layer or the second layer.

Here, at the intersection of power supply wiring Lss, which runs in the horizontal direction of the first layer, and power supply wiring Lss, which runs in the vertical direction of the second layer, both are connected to each other through via V, which is indicated by the X symbol. Thus, because power supply wiring Lss is connected both vertically and horizontally in a net-like configuration, the voltage fluctuations of power supply Vss are such that they can be held in check equally throughout the chip.

In addition, at the intersection of power supply wiring Ldd, which runs in the horizontal direction of the first layer, and power supply wiring Ldd, which runs in the vertical direction of the second layer, both are connected to each other through via V, which is indicated by the X symbol. Thus, because power supply wiring Ldd is connected both vertically and horizontally in a net-like manner, the voltage fluctuations of power supply Vdd can be restrained equally throughout the chip.

Upper region 66a and lower region 66b of p-type stopper 66 of n-type basic cell 60 are located right below power supply wiring Lss. Also, upper region 76a and lower region 76b of n-type stopper 76 of p-type basic cell 70 are located right below power supply wiring Ldd. Therefore, the supply of power to stopper 66 and stopper 76 can be accomplished simply by providing a contact hole at an appropriate position for Lss and Ldd within the width of the wires. A special wire does not have to be extended from power supply wiring Lss and Ldd, which reduces wiring obstructive areas.

Figure 7:
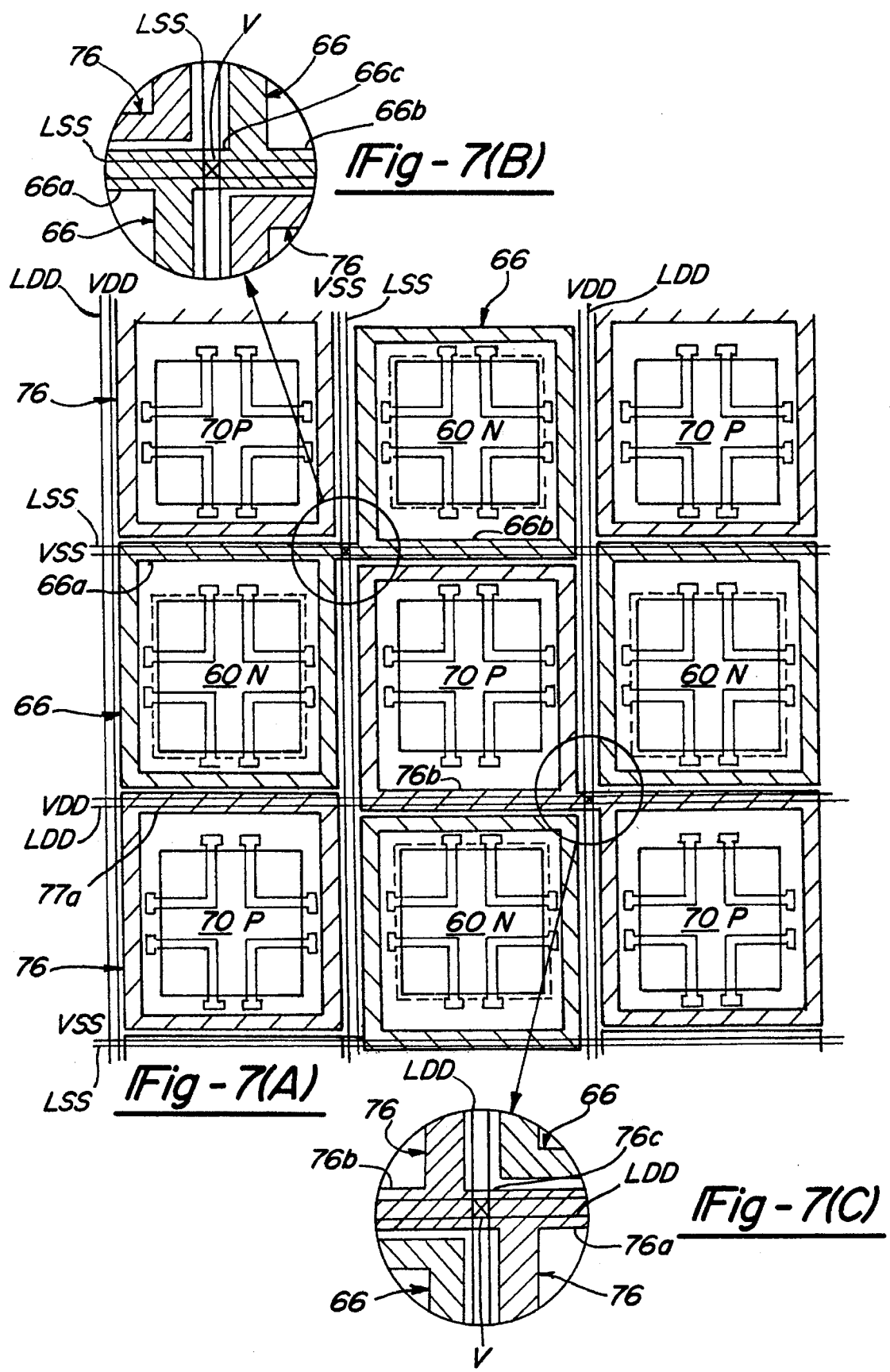
FIG. 7 shows a top view of the stopper arrangement between adjacent basic cells in the array structure of the basic cell of the third embodiment.

FIG. 7 shows another array structure for basic cells 60 and 70 described above. The array structure also has basic cells 60 and 70 arrayed in a checker board configuration. Basic cells 60 and 70 have ring-shaped stoppers 66 and 76. A difference from the structure shown in FIG. 6 is that at the surroundings of via V, which is formed at the intersection of power supply wiring Lss, combined connection region 66c is formed. This connects p-type stoppers 66 and 66 of a pair of basic cells 60 and 60 that are at opposite angles to each other. In addition, at the surroundings of via V, which is formed at the intersection of power supply wiring Ldd, combined connection region 76c is formed. This connects n-type stoppers 76 and 76 of a pair of basic cells 70 and 70 that are at opposite angles to each other.

In this embodiment, since each stopper has a ring shape, it is possible to equally provide power supply voltage to the basic cells. However, since the ring-shaped stoppers for the pair of basic cells that are at an angle opposite to each other are connected by combined connection regions 66c and 76c, even if there are variations in the wiring resistance, the electrical potential of the stopper between the basic cells can be equalized. Moreover, because the combined connection regions 66c and 76c are formed tight below via V, power supply voltage can be supplied to the stoppers simply by providing a contact hole right below via V or in its vicinity, which results in space savings. The contact hole may also be provided in an area other than in the vicinity of via V.

Figure 8:
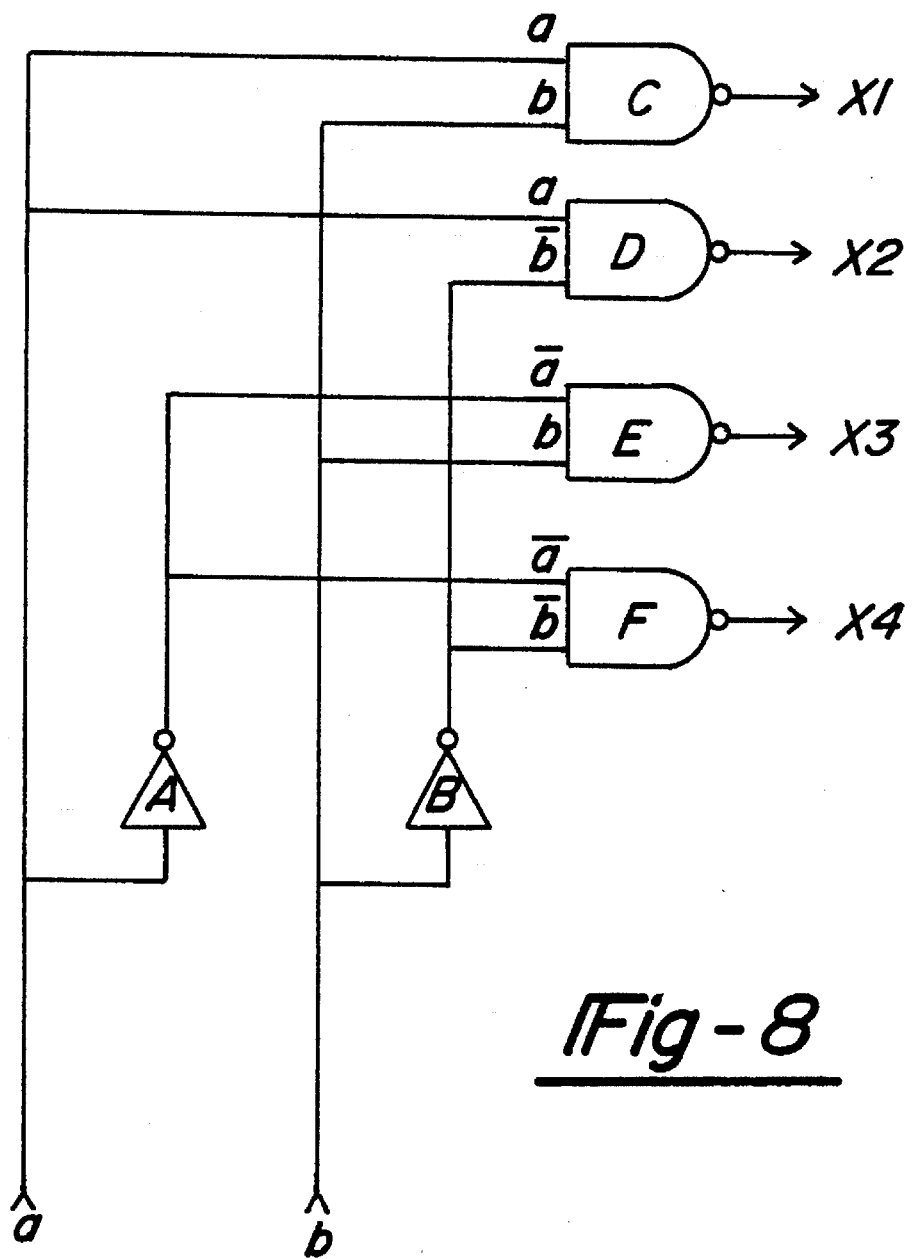
FIG. 8 shows a circuit diagram of one example of a two-input, four-output decoder.
Figure 9:
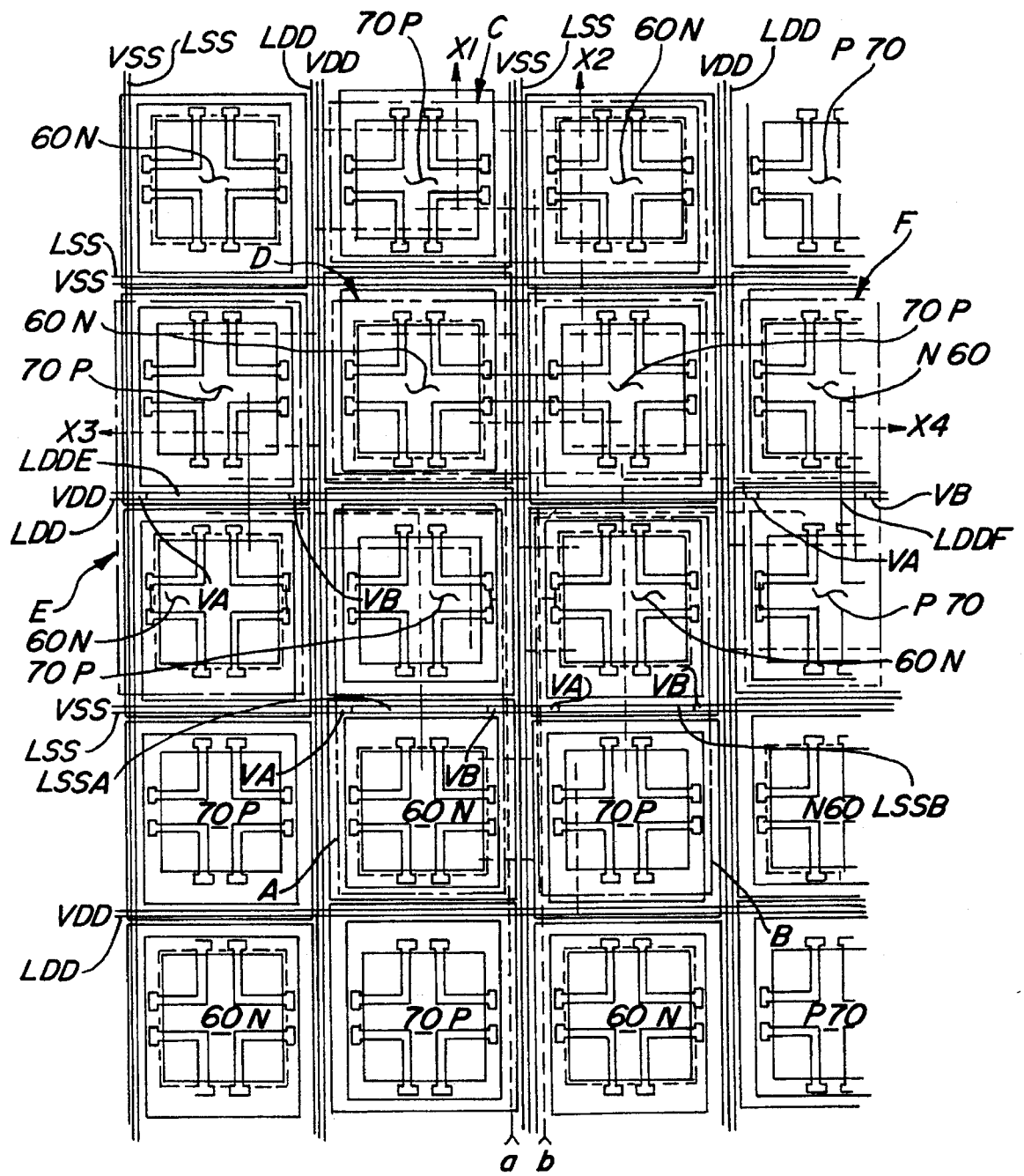
FIG. 9 shows a top view of layout and wiring pattern of the same decoder realized with the array structure of the basic cell shown in FIG. 6.

FIG. 8 is a circuit diagram that shows a two-input-four-output decoder. FIG. 9 shows the layout and wiring pattern for this decoder with the cell array structure shown in FIG. 6. As shown in FIG. 9, the two decoder inverters, A and B, and the four NAND gates, C, D, E and F, can be configured using six CMOS basic cells. In FIG. 9, the contact holes or the vias are indicated by the dots; the wiring within the cells is indicated by the solid lines; and the wiring outside of the cells is indicated by the dotted lines.

Among the CMOS basic cells that form the decoder, CMOS cells A, B, E and F are arranged vertically and CMOS cell C and D are arranged horizontally. As stated above, as a rule, in the wiring pattern, the horizontal wiring is in the first layer and the vertical wiring is in the second layer. The CMOS basic cell is based on the first layer. However, power supply wiring Lss and Ldd will pass in the horizontal direction between n-type basic cells 60 of the vertical CMOS basic cells, A, B, E and F, and p-type basic cell 70. Thus, the first layer of vertical wiring of CMOS cells A, B, E and F and the first layer of power supply wiring will interfere with each other.

For this reason, in this embodiment, in order to allow the pre-rotation wiring library to be used without changing the first layer of wiring within the cell by a rotation operation or a reversal operation of the CMOS basic cell, within the power supply wiring Lss that runs in CMOS basic cell A, the interval between VA and VB is connected by partial wiring LssA of the second layer. Within the power supply wiring Lss that runs in CMOS basic cell B, the interval between VA and VB is connected by partial wiring LssB of the second layer. Within the power supply wiring Ldd that runs in CMOS basic cell E, the interval between VA and VB is connected by partial wiring LddE of the second layer. Within the power supply wiring Ldd that runs in CMOS basic cell F, the interval between VA and VB is connected by partial wiring LddF of the second layer.

Figure 10:
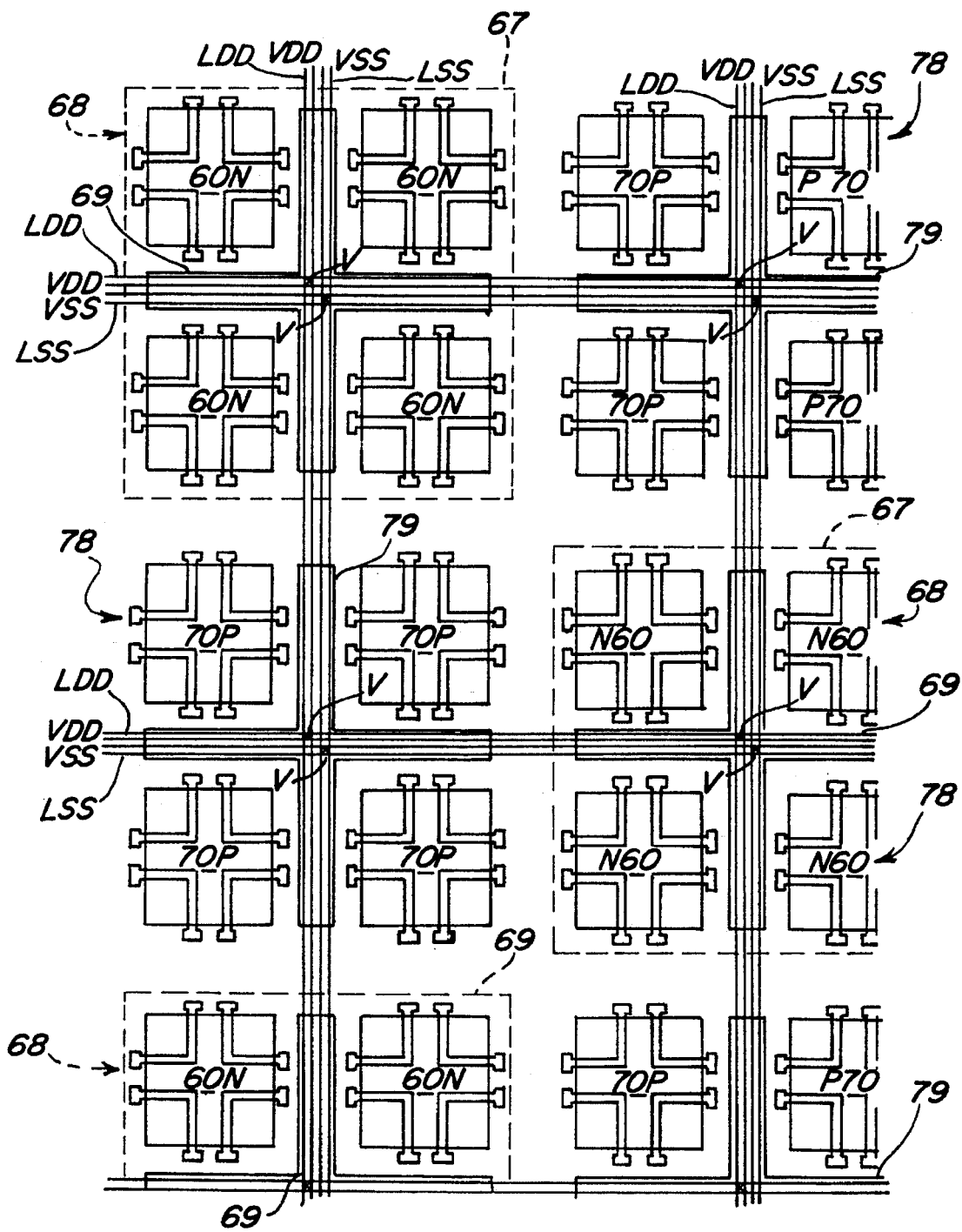
FIG. 10 shows a top view of another array structure of the basic cell of the third embodiment.

FIG. 10 shows another cell array structure. In the cell array structure, a common well 67 is formed for four n-type basic cells. N-type block 68, which is formed from four n-type basic cells, and p-type block 78, which is formed from four p-type basic cells, are arranged in a checker board configuration. Cross-shaped p-type stopper 69 is formed between each basic cell 60 in n-type block 68. Cross-shaped p-type stopper 79 is formed between each basic cell 70 in p-type block 78. Power supply wirings Lss and Ldd are adjacent to each other and pass between n-type block 68 and p-type block 78.

In addition, as shown by the symbol X, a via V is provided at the intersection area between power supply wiring Lss that runs vertically and power supply wiring Lss that runs horizontally as well as the intersection portion between power supply wiring Ldd that runs vertically and power supply wiring Ldd that runs horizontally. By creating high-level regularity through such block units, rotation and reversal operations can be performed even for CMOS block units which include a p-type block and an n-type block as a pair without changing the wiring paths within the CMOS block.

N-type block 68 and p-type block shown in FIG. 10 both have basic cells composed of two rows and two columns. However, in general, the basic cell can have an m row and an m column block, provided m is a positive integer. As for the method of laying down the power supply wiring in this case, it is possible to form, for example, adjacent wirings Lss and Ldd between the basic cells in the block in the row direction (horizontal direction) and the column direction (vertical direction).

Both the n-type block and p-type block have the same number of basic cell rows and columns. However, they are not limited to this. They may be a block with n rows and m columns. If the number of rows and number of columns differ, when the CMOS block rotates '90°, it will not overlap another block perfectly. Only a part of the basic cells within the CMOS block will overlap basic cells in the other CMOS block. Therefore, if both the n-type block and the p-type block are n rows and m columns, the partial matrix k-row-k-column cell in the n-type block that satisfies k≦min (n, m) and the partial matrix k-row-k-column cell in the p-type block will form a partial block. When a rotation operation is performed, it will overlap another partial block of the same kind.

This is significant in the case of a library that does not have internal wiring in regions other than the partial block within the block. It is possible to change the layout through a rotation operation of that partial block without modifying the internal wiring. Moreover, in generalizing the practice in which a block is formed from basic cells, an n-type block may be composed of the nN rows and the mN columns of an n-type basic cell, and a p-type block may be composed of the nP rows and the mP columns of a p-type basic cell. In this case, the vertical and horizontal size of the n-type type block is made the same size as that of the n-type block. However, it is not limited to this. Even if the CMOS basic cell is composed of a partial block in which there are n1 rows and n2 columns of the n-type basic cells and p1 rows and p2 columns of the p-type basic cells, there is no problem if it satisfies n1, n2≦nN, mN and p1, p2≦nP, mP.

Figure 11:
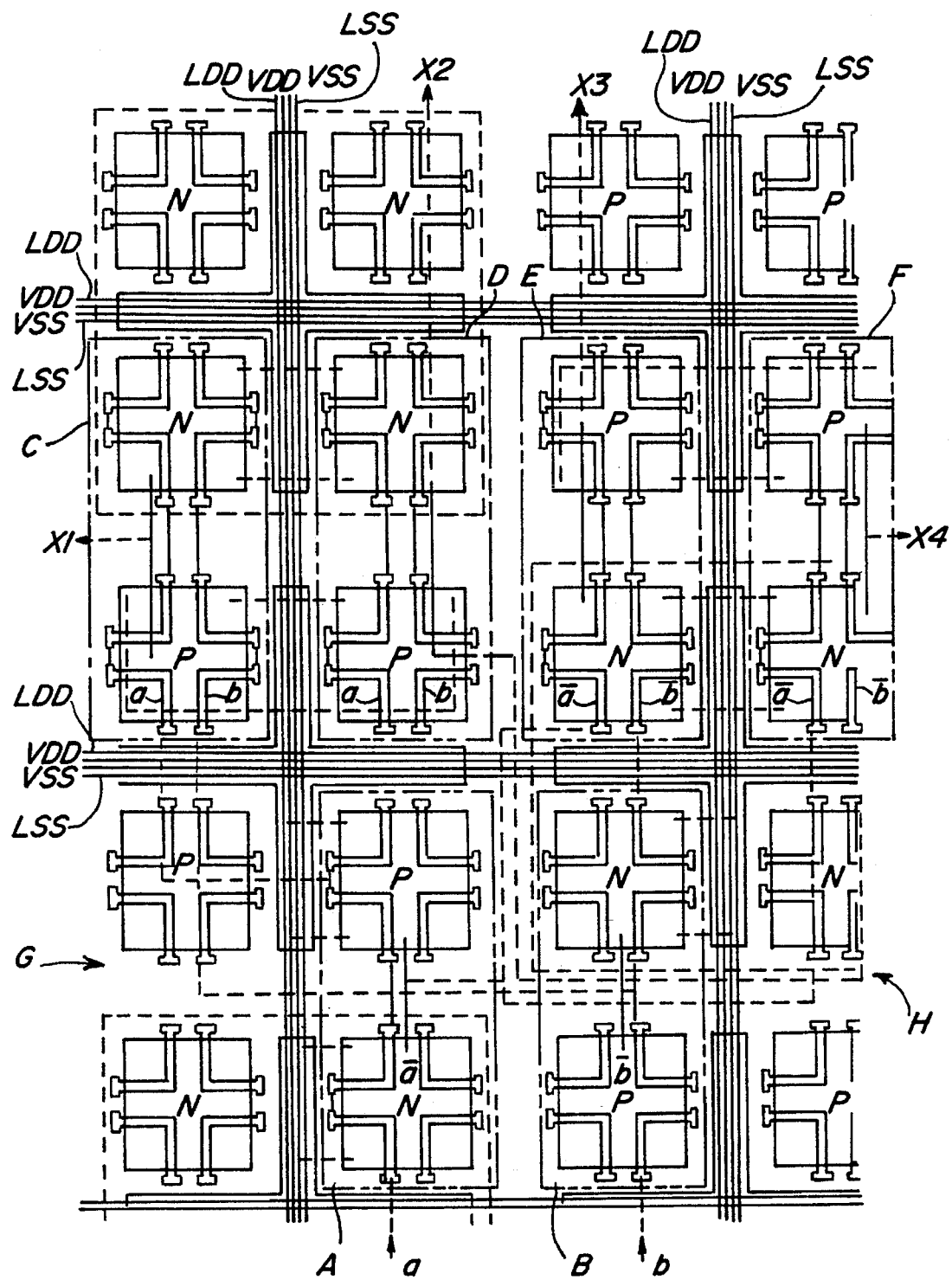
FIG. 11 shows a top view of the layout and wiring pattern of the same decoder realized with the array structure of the basic cell shown in FIG. 10.

FIG. 11 shows a layout and wiring diagram that implements the decoder shown in FIG. 8 with the array structure shown in FIG. 10. As shown in FIG. 11, it is possible to form the two decoder inverters, A and B, and the four decoder NAND gates, C, D, E and F, with six CMOS basic cells. In FIG. 11, the contact holes or the vias are indicated by the dots; the wiring within the cell is indicated by the solid lines; and the wiring outside of the cell is indicated by the dotted lines. Here, the region for locating input wiring a and b and output wiring X1, X2, X3 and X4 is indeterminate due to the relationship with the other logic blocks. However, CMOS basic cells G and H, which are in addition to CMOS basic cells A through F, do not function properly as transistors. They are used as signal wire regions from the inverters A and B to the NAND gates C and F. If the internal signal wires of the decoder are formed only in the CMOS basic cell A through F regions, CMOS basic cells G and H can be utilized effectively. Therefore, in this embodiment, the CMOS basic cell G and H regions can be made blank regions by changing the layout and wiring pattern in FIG. 11 to the layout and wiring pattern shown in FIG. 12.

Figure 12:
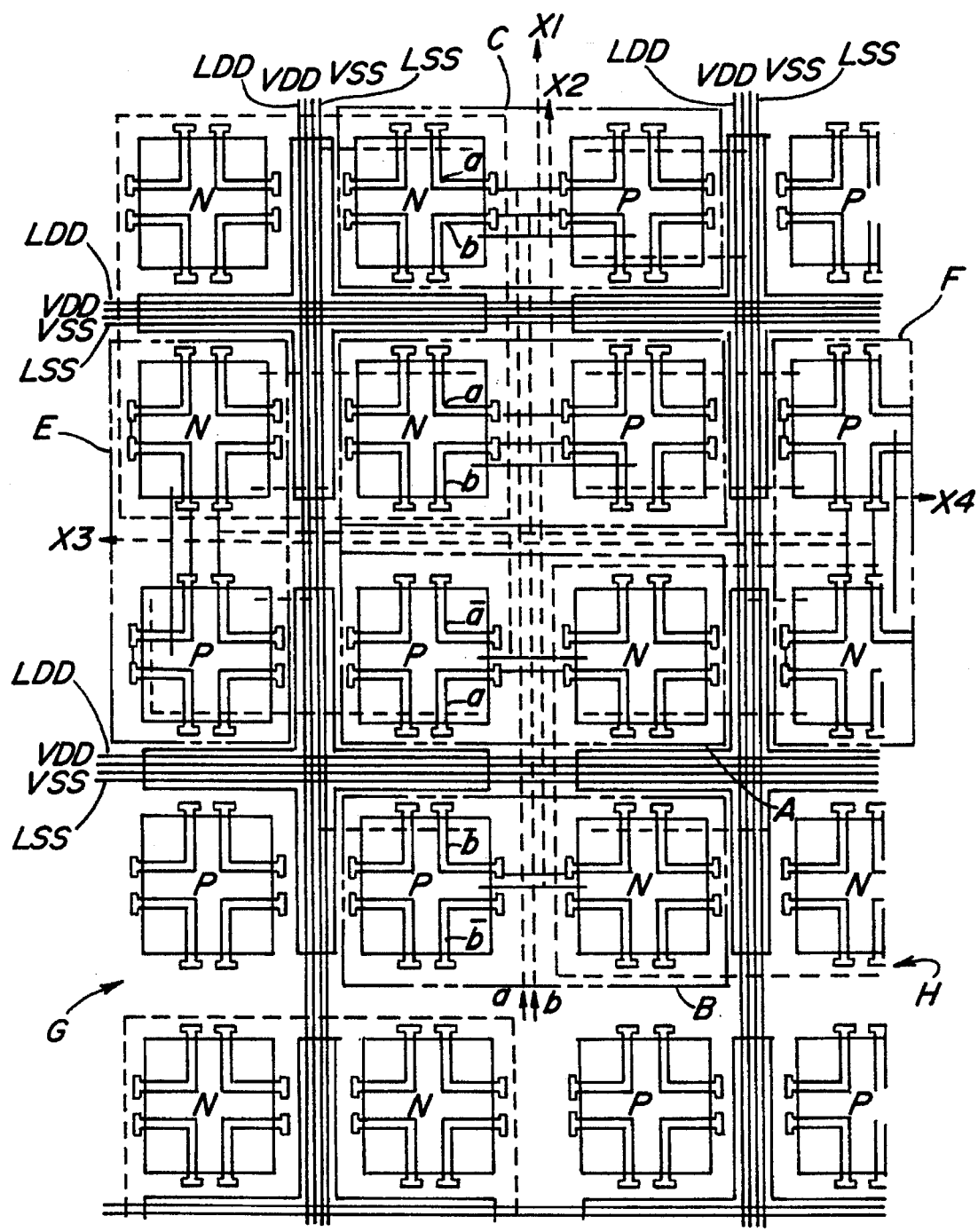
FIG. 12 shows a top view of another layout and wiring pattern of the same decoder realized with the array structure of the basic cell shown in FIG. 10.

For example, after the layout and wiring pattern in FIG. 11 has been drawn by automatic layout and wiring processing, if this pattern in FIG. 11 is to be changed to the layout and wiring pattern in FIG. 12, a rotation of basic cells 60 and 70 is required, i.e., a ±90° rotation of the wiring pattern of the CMOS basic cell is required. With a parallel shift and a 90° rotation of the wiring pattern of CMOS basic cell A in FIG. 11, the cell becomes CMOS basic cell A in FIG. 12. In this case, the wiring pattern in cell A (shown by the solid line) does not change. CMOS basic cell B in FIG. 12 comes about through a −90° rotation and a reverse operation relative to the horizontal axis of the wiring pattern of CMOS basic cell B in FIG. 11. In this case as well, the internal wiring pattern does not change. CMOS basic cell C in FIG. 12 comes about through a +90° rotation of the wiring pattern of CMOS basic cell C in FIG. 11. The internal wiring pattern does not change in this case either.

CMOS basic cell D in FIG. 12 comes about through a +90° rotation and a reverse operation relative to the horizontal axis of the wiring pattern of CMOS basic cell D in FIG. 11. In this case as well, the internal wiring pattern does not change. CMOS basic cell E in FIG. 12 comes about through a +90° rotation and a reverse operation relative to the horizontal axis of the wiring pattern of CMOS basic cell E in FIG. 11. In this case as well, the internal wiring pattern still does not change. CMOS basic cell F in FIG. 11 remains unmoved.

The reason to make basic cells 60 and 70 having ±90° rotating symmetry is because in the same manner the CMOS basic cells also have ±90° rotating symmetry. Also, because they have reverse symmetry relative to the vertical axis or the horizontal axis, a degree of freedom is achieved to allow corresponding changes in the layout of the CMOS basic cells by rotation or reverse operation (mirror reverse operation) without changing the internal wiring pattern (wiring library). As a result, it is possible to make CMOS basic cell G and H regions blank, and these blank regions can be used as transistors for other basic gates or logic blocks. This is an improvement in the utilization of the basic cells as transistors.

Fourth Embodiment

Figure 13:
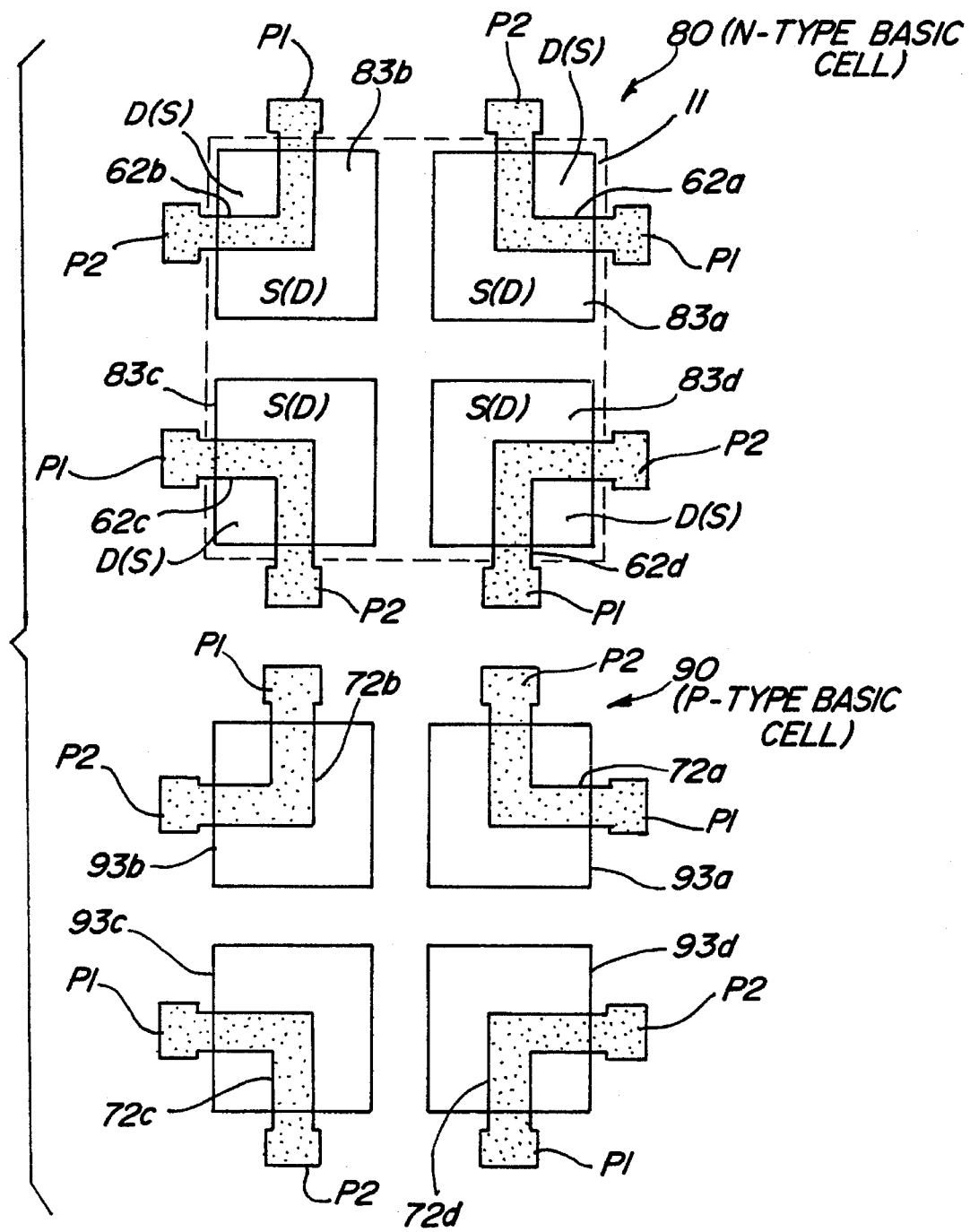
FIG. 13 shows a top view of the array structure of the basic cell according to the fourth embodiment of this invention.
Figure 14:
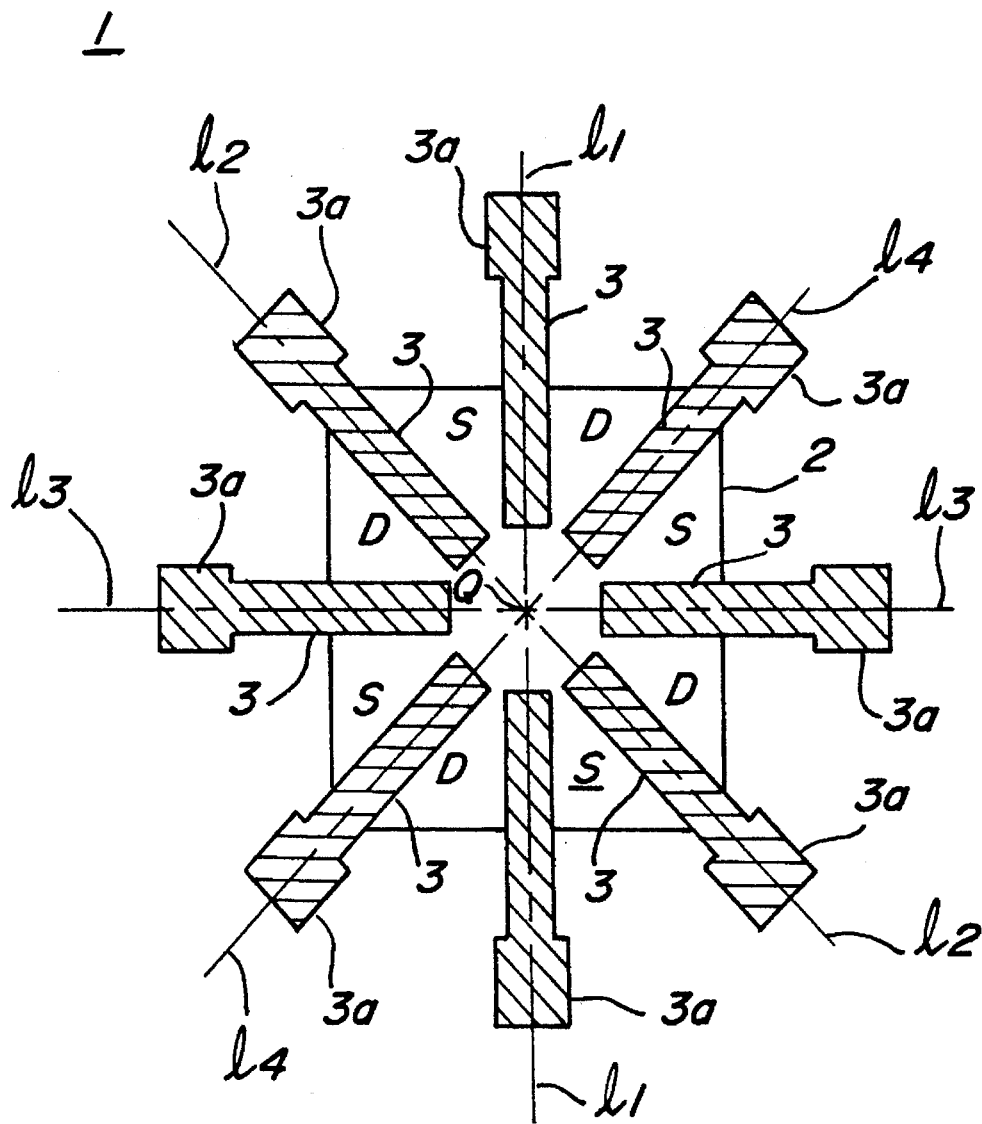
FIG. 14 shows a top view of the structure of a prior art basic cell.

FIG. 13 shows the structure of the basic cell according to the fourth embodiment of this invention. Basic cells 60 and 70 in the third embodiment have common dopant regions 13 and 23. However, in this embodiment, the dopant regions of n-type basic cell 80 and p-type basic cell 90 each are formed relative to a gate electrode. In basic cell 80, p-well 11 occupies a planar rectangular shaped (square shaped) region that is formed by diffusing a p-type dopant on an n-type substrate. Four hook-shaped polysilicon gate electrodes 62a to 62d each lie across a corner of p-well 11 and each are formed through a gate insulation layer. High concentration n-type dopant regions 83a to 83d each occupy the planar rectangular shaped (square shaped) region that is formed through self-alignment by ion implantation of an n-type dopant with the gate electrode as a mask. Hook-shaped gate electrodes 62a to 62d each have wiring connection areas P1 and P2 on both ends.

Basic cell 90 has the same structure as basic cell 80. In p-type basic cell 90, high concentration p-type dopant regions 93a to 93d occupy a planar rectangular shaped (square shaped) region. Four hook-shaped polysilicon gate electrodes 62a to 62d each lie across a corner of one of the dopant regions 93a to 93d and each are formed through a gate insulation layer. Hook-shaped gate electrodes 72a to 72d each have wiring connection areas P1 and P2 on both ends. Basic cells 80 and 90 have better wiring layout capability and excellent wiring capability for the gate electrodes.

The basic cells in this embodiment also can be arranged in the array structure described above, and can form CMOS unit basic cells. Their layout can be changed easily by a ±90° rotation and a reverse operation without changing the wiring pattern within the cell.

The shape of the single gate electrodes of the embodiments described above is either essentially linearly shaped having a hook shape that is open to the outside of the cell. However, it is not limited to these. They may take other shapes, such as a curved shape. The point is that the dopant region should be divided up into a source region and a drain region in the inner and the outer regions along the radial direction relative to the center of the cell. Thus, the gate electrodes need only be oriented on a circumference of a circle having a center overlapping the cell center.

Also, a gate electrode may be oriented on a circumference of a circle having a center overlapping the cell center and another gate electrode may be positioned on a circumference of another concentric circle. When the reverse rotation of the cell is not taken into consideration, it is acceptable to have only one gate electrode wiring connection area. The cell composition of this invention has rotating symmetry relative to the center of the cell. Therefore, the shape of the cell is not limited to a square. It can take other shapes, for instance, a polygon, such as a regular hexagon, or a circular shape.

In addition, there is no limitation to the case in which each gate electrode is formed at 90° relative to the center of the cell, as in the embodiments above. It is also possible to form adjacent gate electrodes each at 45°, 30° or 15° relative to the center of the cell. However, in such a case, multiple layer wiring with intersecting angles, such as 45°, 30° or 15°, may also be formed. Further, although in the embodiments above, an n-type substrate is used, a p-type substrate may also be used.

While the invention has been described in conjunction with several specific embodiments, it is evident to those skilled in the art that many further alternatives, modifications and variations will be apparent in light of the foregoing description. Thus, the invention described herein is intended to embrace all such alternatives, modifications, applications and variations as may fall within the spirit and scope of the appended claims.

What is claimed is:

1. A semiconductor device that is characterized by forming the desired electronic circuits by having a plurality of arranged basic cells and by appropriately connecting the inside of the said basic cells and the interval between the said basic cells with wiring, each basic cell having a well of doped semiconductive material and a plurality of gate electrodes overlying the well, each gate electrode further having wiring connection areas, wherein the aforesaid basic cells have 4n (where n is a natural number) MIS transistors and the wiring connection areas of the said transistors have rotating symmetry that overlaps the same type of wiring connection areas of other transistors before rotation by means of a ±90° rotational operation, and wherein the gate electrodes of the said transistors are essentially oriented along the circumferential direction relative to the center of the cell.

2. The semiconductor device in claim 1, wherein each of the aforesaid gate electrodes is essentially linear in shape.

3. The semiconductor device in claim 1, wherein each of the aforesaid gate electrodes is essentially a hook shape that opens to the outside of the cell.

4. The semiconductor device in claim 1 wherein the aforesaid basic cell has a dopant region which is common to the transistors of each basic cell and serves as the source or drain region of the transistors relative to the aforesaid gate electrodes.

5. The semiconductor device in claim 1 wherein the aforesaid basic cell has an independent dopant region that serves as the source or drain region relative to the aforesaid gate electrodes.

6. The semiconductor device in claim 1, wherein the aforesaid gate electrodes having wiring connection areas on both ends.

7. A semiconductor device with a plurality of arrayed first conductive basic cells and second conductive basic cells, each basic cell having a well of doped semiconductive material and a plurality of gate electrodes overlying the well, each gate electrode further having wiring connection areas, wherein wiring is used to make appropriate connections within the basic cells and between the said basic cells to form the desired electronic circuit, and the said basic cells have 4n (where n is a natural number) MIS transistors and the wiring connection areas of the said transistors have rotating symmetry that overlaps the same type of wiring connection areas of other transistors before rotation by means of a ±90° rotational operation; wherein the gate electrodes of the transistors are essentially oriented along the circumferential direction relative to the center of the cell; and wherein the first conductive basic cells and second conductive basic cells are arrayed from top and bottom and left and right.

8. The semiconductor device in claim 7, wherein, lying between the aforesaid first conductive basic cells and the second conductive basic cells, are first power supply lines and second power supply lines formed alternately both in the row direction and the column direction.

9. The semiconductor device in claim 8, further comprising a stopper region which is located below the first power supply lines and the second power supply lines and electrically connected thereto.

10. The semiconductor device in claim 9, wherein the aforesaid stopper region has a ring shape that surrounds the aforesaid basic cell.

11. The semiconductor device in claim 8, wherein there is a continuity means that connects wires to an intersecting area between the aforesaid first power supply lines in the row direction and that in the column direction; and wherein therein a continuity means that connects wires to an intersecting area between the aforesaid second power supply lines in the row direction and that in the column direction.

12. The semiconductor device in claim 11, wherein the aforesaid stopper regions of a pair of same type basic cells that are located at opposite angles to each other among the aforesaid basic cells are connected in combined connection regions.

13. A semiconductor device with a plurality of arrayed first conductive basic cells and second conductive basic cells; wherein wiring is used to make appropriate connections within the basic cells and between the basic cells to form the desired electronic circuit, each basic cell having a well of doped semiconductive material and a plurality of gate electrodes overlying the well, each gate electrode further having wiring connection areas, and the basic cells have 4n (where n is a natural number) MIS transistors and the wiring connection areas of the said transistors have rotating symmetry that overlaps the same type of wiring connection areas of other transistors before rotation by means of a ±90° rotational operation; wherein the gate electrodes of the transistors are essentially oriented along the circumferential direction relative to the center of the cell; wherein the size of the aforesaid first conductive basic cells and second conductive basic cells are essentially the same, and wherein a matrix of n-rows and m-columns of the first conductive cells defines a first conductive block and wherein a matrix of n-rows and m-columns of the second conductive cells define a second conductive block; and wherein the first conductive blocks and aforesaid second conductive blocks are arrayed from top and bottom and right and left.

14. The semiconductor device in claim 13, wherein mutually adjacent first power supply lines and second power supply lines are formed in the row direction and in the column direction between the aforesaid first conductive basic cells in the aforesaid first conductive blocks and between the aforesaid second conductive basic cells in the aforesaid second conductive blocks.

15. The semiconductor device in claim 14, further comprising a basic cell stopper region connecting to the power supply lines and located right below the first power supply lines and the second power supply lines.

16. The semiconductor device in claim 14, wherein a continuity means has been provided that connects both lines to the intersection area between the aforesaid first power supply line that extends in the row direction and the aforesaid first power supply line that extends in the aforesaid column direction; and wherein a continuity means has been provided that connects both wires to the intersection area between the aforesaid second power supply line that extends in the row direction and the aforesaid first power supply line that extends in the aforesaid column direction.

17. A semiconductor device with a plurality of arrayed first conductive basic cells and second conductive basic cells, wherein wiring is used to make appropriate connections within the basic cells and between the basic cells to form the desired electronic circuit, each basic cell having a well of doped semiconductive material and a plurality of gate electrodes overlying the well, each gate electrode further having wiring connection areas and the basic cells have 4n (where n is a natural number) MIS transistors and the wiring connection areas of the transistors have rotating symmetry that overlaps the same type of wiring connection areas of other transistors before rotation by means of a ±90° rotational operation; wherein the gate electrodes of the said transistors are essentially oriented along the circumferential direction relative to the center of the cell; wherein a matrix of n1-rows and m1-columns of the first conductive basic cells define a first conductive block, and wherein a matrix of n2-row and n2-column of the second conductive basic cells define a second conductive block; wherein the size of the first conductive block and that of the second conductive block are essentially the same and the first conductive block and the second conductive block are mutually arrayed from top and bottom and left and right.

18. A semiconductor gate array device comprising:
a matrix of basic cells arranged in rows and columns on a semiconductor substrate, a first set of cells being of one conductivity type and a second set of cells being of an opposite conductivity type, each cell including:
   a) a polygonal region of a given conductivity type having a plurality of corners; and
   b) at least four transistors including gate electrodes therefor, each electrode extending across one of the corners and having opposite ends thereof spaced from said region which serve as wiring interconnection pads; and
   c) the wiring interconnection pads being rotatably symmetrically located about the circumference of said region so that the wiring pads of one transistor would be registered with wiring pads of an adjacent transistor if the basic cell is rotated 90°.

* * * * *